(12) United States Patent
Xia et al.

(10) Patent No.: US 11,646,326 B2
(45) Date of Patent: May 9, 2023

(54) MANUFACTURING METHOD FOR CARBON NANOTUBE CONDUCTIVE FILM, DISPLAY PANEL AND DISPLAY DEVICE

(71) Applicants: Beihai HKC Optoelectronics Technology Co., Ltd., Beihai (CN); HKC Corporation Limited, Shenzhen (CN)

(72) Inventors: Yuming Xia, Beihai (CN); En-Tsung Cho, Beihai (CN); Haijiang Yuan, Beihai (CN)

(73) Assignees: Beihai HKC Optoelectronics Technology Co., Ltd., Beihai (CN); HKC CORPORATION LIMITED, Shenzhen (CN)

( * ) Notice: Subject to any disclaimer, the term of this patent is extended or adjusted under 35 U.S.C. 154(b) by 150 days.

(21) Appl. No.: 17/325,192

(22) Filed: May 19, 2021

(65) Prior Publication Data
US 2022/0037366 A1 Feb. 3, 2022

(30) Foreign Application Priority Data
Jul. 29, 2020 (CN) .......................... 202010744356.1

(51) Int. Cl.
*H01L 27/12* (2006.01)
*G09G 3/20* (2006.01)
*G09G 3/00* (2006.01)

(52) U.S. Cl.
CPC ............. *H01L 27/124* (2013.01); *G09G 3/20* (2013.01); *H01L 27/1259* (2013.01); *G09G 3/035* (2020.08)

(58) Field of Classification Search
CPC ...... H01L 27/124; H01L 27/1259; G09G 3/20
(Continued)

(56) References Cited

U.S. PATENT DOCUMENTS 8,809,230 B2 * 8/2014 Worsley ................ C01B 32/162
252/502
2008/0284719 A1 * 11/2008 Yoshida .............. G02F 1/13392
349/37
(Continued)

FOREIGN PATENT DOCUMENTS

CN 1165209 A 11/1997

OTHER PUBLICATIONS

"Atmospheric pressure atomic layer deposition of iron oxide nanolayer on the Al2O3/SiO2/Si substrate for mm-tall vertically aligned CNTs growth", Sahar Vahdatifar, Journal of Materials Science.

*Primary Examiner* — Charles S Chang

(57) ABSTRACT

The present application discloses a manufacturing method for a carbon nanotube conductive film, a display panel and a display device. The manufacturing method for the carbon nanotube conductive film includes steps of: forming a mesoporous silica; depositing a catalyst layer in a channel of the mesoporous silica by atomic layer deposition; manufacturing the mesoporous silica with the catalyst layer deposited in the channel into a mesoporous silica film; introducing a carbon matrix precursor into the channel of the mesoporous silica film by chemical vapor deposition, and reacting under the catalysis of the catalyst layer to form a carbon nanotube film; and removing the mesoporous silica and the catalyst layer from the carbon nanotube film to form the transparent carbon nanotube conductive film.

18 Claims, 7 Drawing Sheets

(58) Field of Classification Search
USPC .......................................... 349/110–111, 139
See application file for complete search history.

(56) References Cited

U.S. PATENT DOCUMENTS

| 2013/0085059 A1* | 4/2013 | Jangbarwala | .......... B01J 21/185 |
| | | | 502/355 |
| 2020/0227734 A1* | 7/2020 | Zhamu | .................. H01M 4/386 |

\* cited by examiner

```
┌─────────────────────────────────────────────────────────────┐
│ Placing the mesoporous silica film in a chemical vapor      │
│ deposition chamber, then introducing a gas mixture of       │── S41
│ argon and hydrogen, and heating                             │
└─────────────────────────────────────────────────────────────┘
                              │
                              ▼
┌─────────────────────────────────────────────────────────────┐
│ Introducing the carbon matrix precursor into the chemical   │
│ vapor deposition chamber, and cooling to give the carbon    │── S42
│ nanotube film containing single-walled carbon nanotubes     │
└─────────────────────────────────────────────────────────────┘
```

FIG. 5

```
┌─────────────────────────────────────────────────────────────┐
│ Heating and annealing the carbon nanotube film              │── S51
└─────────────────────────────────────────────────────────────┘
                              │
                              ▼
┌─────────────────────────────────────────────────────────────┐
│ Placing the carbon nanotube film subjected to heating and   │
│ annealing in a hydrofluoric acid or sodium hydroxide        │── S52
│ solution, to give a carbon nanotube film with the           │
│ mesoporous silica removed                                   │
└─────────────────────────────────────────────────────────────┘
                              │
                              ▼
┌─────────────────────────────────────────────────────────────┐
│ Placing the carbon nanotube film with the mesoporous silica │
│ removed in an aluminum chloride solution or ferric chloride │── S53
│ solution, to give a transparent carbon nanotube conductive  │
│ film with the catalyst layer removed                        │
└─────────────────────────────────────────────────────────────┘
```

FIG. 6

MANUFACTURING METHOD FOR CARBON NANOTUBE CONDUCTIVE FILM, DISPLAY PANEL AND DISPLAY DEVICE

The present application claims priority to Chinese Patent Application No. 202010744356.1, filed Jul. 29, 2020, which is hereby incorporated by reference herein as if set forth in its entirety.

TECHNICAL FIELD

The present application relates to the technical field of display, particularly to a manufacturing method for a carbon nanotube conductive film, a display panel and a display device.

BACKGROUND

The statements here only provide background information related to the present application, but not necessarily constitute related art.

With the rapid development of the electronic industry, a variety of technology products emerge endlessly, among which transparent conductive film is a necessary material in the fields of display panels, touch panels, solar cells and the like. At present, the mainstream transparent conductive film material is an Indium Tin Oxide (ITO) film. ITO has conductivity and transparency, enabling it to be widely applied in various related fields.

However, with the pursuit of flexible electronic devices becoming a trend, the flexibility of ITO is difficult to satisfy the demands of flexible electronic devices, therefore, how to manufacture a transparent conductive film with good flexibility has become an urgent technical problem to be solved.

SUMMARY

In view of this, the purpose of the present application is to provide a manufacturing method for a carbon nanotube conductive film, a display panel and a display device, so as to give a transparent conductive film with good flexibility.

The present application discloses a manufacturing method for a carbon nanotube conductive film, including steps of:

forming a mesoporous silica;

depositing a catalyst layer in a channel of the mesoporous silica by atomic layer deposition:

manufacturing the mesoporous silica with the catalyst layer deposited in the channel into a mesoporous silica film;

introducing a carbon matrix precursor into the channel of the mesoporous silica film by chemical vapor deposition, and reacting under the catalysis of the catalyst layer to form a carbon nanotube film; and removing the mesoporous silica and the catalyst layer from the carbon nanotube film to form the transparent carbon nanotube conductive film.

The present application further discloses a display panel, including an active switch, where the active switch includes a substrate, a gate metal layer, a gate insulating layer, an active layer, an ohmic contact layer, a source/drain metal layer, a passivation layer and a carbon nanotube conductive film which are sequentially stacked, the carbon nanotube conductive film is connected to the source/drain metal layer through a via hole in the passivation layer.

The present application further discloses a display device, including a display panel and a drive circuit configured for driving the display panel, where the display panel includes an active switch, the active switch includes a substrate, a gate metal layer, a gate insulating layer, an active layer, an ohmic contact layer, a source/drain metal layer, a passivation layer and a carbon nanotube conductive film which are sequentially stacked, the carbon nanotube conductive film is connected to the source/drain metal layer through a via hole in the passivation layer.

Compared with a solution in which a transparent conductive film is prepared from ITO, in the present application, a catalyst layer is deposited in a channel of a mesoporous silica by atomic layer deposition to give a mesoporous silica film with the catalyst layer, with high porosity and high specific surface area, so that when a carbon matrix precursor is subsequently introduced, there is enough space in the channel for fill reaction to give a carbon nanotube conductive film with excellent compactness and flexibility, thus improving the conductive effect. In addition, in the present application, the carbon matrix precursor is introduced into the channel of the mesoporous silica film by chemical vapor deposition to form carbon nanotubes under the catalysis of the catalyst layer, so as to give a carbon nanotube film with good stability, and the formed carbon nanotube conductive film becomes transparent after the mesoporous silica and the catalyst layer are removed from the carbon nanotube film, thus increasing the aperture ratio and light transmittance.

BRIEF DESCRIPTION OF DRAWINGS

The accompanying drawings, which are included to provide a further understanding of embodiments of the present application and constitute a part of the specification, illustrate embodiments of the application and, together with the text description, explain the principles of the application. Obviously, the drawings in the following description are merely some embodiments of the present application, and those skilled in the art can obtain other drawings according to the drawings without any inventive labor. In the drawings:

FIG. 5 is a flowchart of manufacturing a carbon nanotube film according to an embodiment of the present application;

FIG. 6 is a flowchart of manufacturing a transparent carbon nanotube conductive film according to an embodiment of the present application;

DETAILED DESCRIPTION OF EMBODIMENTS

Figure 1:
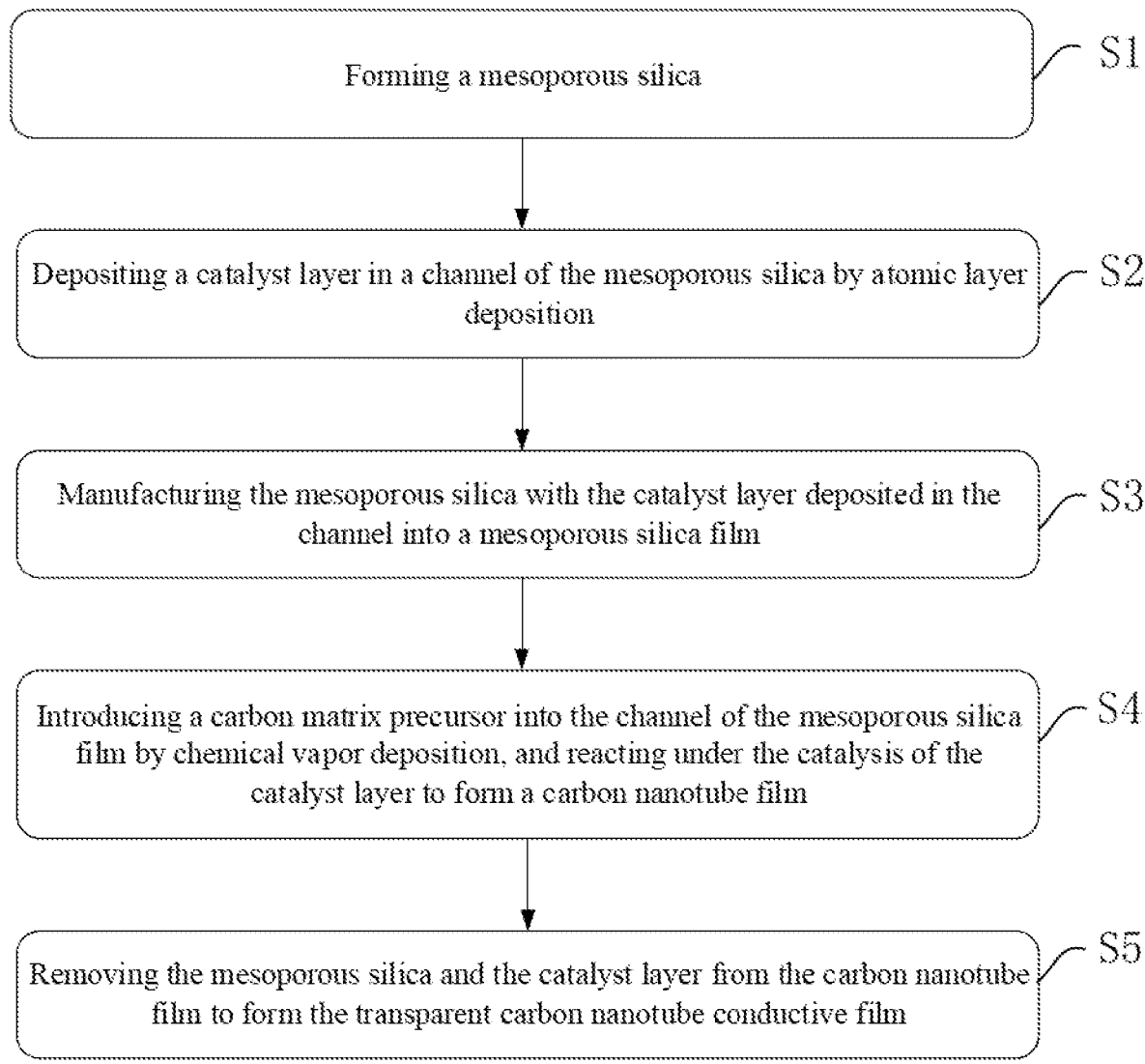
FIG. 1 is a flowchart of a manufacturing method for a carbon nanotube conductive film according to an embodiment of the present application.

It should be understood that the terminology, specific structural and functional details disclosed are merely exemplary for the purpose of describing specific embodiments. However, the present application may be embodied in many alternative forms and should not be construed as being limited to the embodiments set forth herein.

In the description of the present application, the terms "first" and "second" are only for the purpose of description and cannot be construed to indicate relative importance or imply an indication of the number of technical features indicated. Therefore, unless otherwise stated, a feature defined as "first" and "second" may explicitly or implicitly include one or more of the features; "multiple" means two or more. The term "include" and any variations thereof are intended to be inclusive in a non-closed manner, that is, the presence of addition of one or more other features, integers, steps, operations, units, components and/or combinations thereof may be possible.

In addition, the terms "center", "horizontally", "up", "down", "left", "right", "vertical", "horizontal", "top", "bottom", "inner". "outer" and the like for indicating an orientation or positional relationship are based on the description of the orientation or relative positional relationship shown in the accompanying drawings, and are only simplified description facilitating description of the application, and are not intended to indicate that the device or element referred to must have a particular orientation, be configured and operated in a particular orientation, and therefore cannot be construed as limiting the present application.

In addition, unless expressly specified and defined otherwise, the terms "mount", "attach" and "connect" are to be understood broadly, for example, it can be a fixed connection, a detachable connection, or an integral connection; it can be an either mechanical connection or an electrical connection; it can be a direct connection or an indirect connection through an intermediate medium, or an internal connection between two elements. For those skilled in the art, the specific meaning of the above terms in this application can be understood according to the specific circumstances.

In a display panel, a thin film transistor is often configured as a switch component, and generally has a structure of stacking a substrate, a gate metal layer, a gate insulating layer, an active layer, an ohmic contact layer, a source/drain metal layer, a passivation layer and a transparent electrode layer. The transparent electrode layer usually made of Indium Tin Oxide (ITO) is connected to the source/drain metal layer through a via hole in the passivation layer.

In this regard, the inventor found that there are some problems with the ITO, for example: (1) the ITO exhibits uneven light absorption in the visible light range and is not suitable for fill-band operation; (2) the ITO has low conductivity, which is likely to result in poor product effects, and the thickness of a transparent electrode layer is thick, so that the development trend of thinner and lighter touch control markets is not met; (3) the ITO material is very brittle and can be easily damaged during industrial preparation, resulting economic losses and waste of resources, so that the ITO is not suitable for the development trend of flexible touch screens in the future; (4) the ITO has unstable chemical properties and poor heat dissipation, which greatly limits its application to high power devices; and (5) the ITO material is toxic, which is not good for environmental protection, meanwhile, indium is a rare element with low reserves and increasing price, which is a waste of resources, and is contrary to the inevitable trend of green energy saving and environmental protection and market economy development in the future.

Based on this, the inventor sought the possibility of replacing the ITO by carbon nanotubes due to their good electromagnetic, thermal and optical properties. First, in terms of electromagnetic properties, the structure of carbon nanotubes is the identical as the lamellar structure of graphite, so carbon nanotubes have good electrical property; moreover, it is theoretically predicted that the conductivity of carbon nanotubes depends on the tube diameter and helix angle of tube wall, exhibiting properties of conductors and semiconductors; the resistance of complete carbon nanotubes is one order of magnitude less than that of defective carbon nanotubes; the radial resistance of carbon nanotubes is larger than the axial resistance; and both carbon nanotube bundles and individual nanotubes exhibit superconductivity, while the latter exhibit lower temperature. Second, in terms of thermal properties, carbon nanotubes have good heat transfer property, and good heat exchange property along the length direction due to their large length-diameter ratio; carbon nanotubes have higher thermal conductivity, and the thermal conductivity of a composite doped with a trace amount of carbon nanotube will be greatly improved. Finally, in terms of optical properties, carbon nanotubes have good field emission property; and carbon nanotube films have strong absorption effect on sunlight. Therefore, carbon nanotube conductive films made of carbon nanotubes are receiving increasing attention.

Meanwhile, the inventor improved the carbon nanotube conductive film for application in the field of flexible display.

The present application will be further described below with reference to the accompanying drawings and optional embodiments.

FIG. 1 is a flowchart of a manufacturing method for a carbon nanotube conductive film according to the present application. As shown in FIG. 1, an embodiment of the present application discloses a manufacturing method for a carbon nanotube conductive film, including steps of:

S1: forming a mesoporous silica;

S2: depositing a catalyst layer in a channel of the mesoporous silica by atomic layer deposition;

S3: manufacturing the mesoporous silica with the catalyst layer deposited in the channel into a mesoporous silica film;

S4: introducing a carbon matrix precursor into the channel of the mesoporous silica film by chemical vapor deposition, and reacting under the catalysis of the catalyst layer to form a carbon nanotube film; and S5: removing the mesoporous silica and the catalyst layer from the carbon nanotube film to form the transparent carbon nanotube conductive film.

Generally, most of the techniques for manufacturing carbon nanotube conductive films are arc discharge, laser evaporation, chemical vapor deposition or the like, however, most of the carbon nanotube conductive films manufactured by these techniques have small specific surface area, large gaps between carbon nanotubes, and poor performance. In the present application, a catalyst layer is deposited in a channel of a mesoporous silica by atomic layer deposition to give a mesoporous silica film with the catalyst layer, with high porosity and high specific surface area, so that when a carbon matrix precursor is subsequently introduced, there is enough space in the channel for full reaction to give a carbon nanotube conductive film with excellent compactness and flexibility, thus improving the conductive effect. In addition, in the present application, the carbon matrix precursor is introduced into the channel of the mesoporous silica film by chemical vapor deposition to form carbon nanotubes under the catalysis of the catalyst layer, so as to give a carbon nanotube film with good stability, and the formed carbon nanotube conductive film becomes transparent after the mesoporous silica and the catalyst layer are removed from the carbon nanotube film, thus increasing the aperture ratio and light transmittance.

Figure 2:
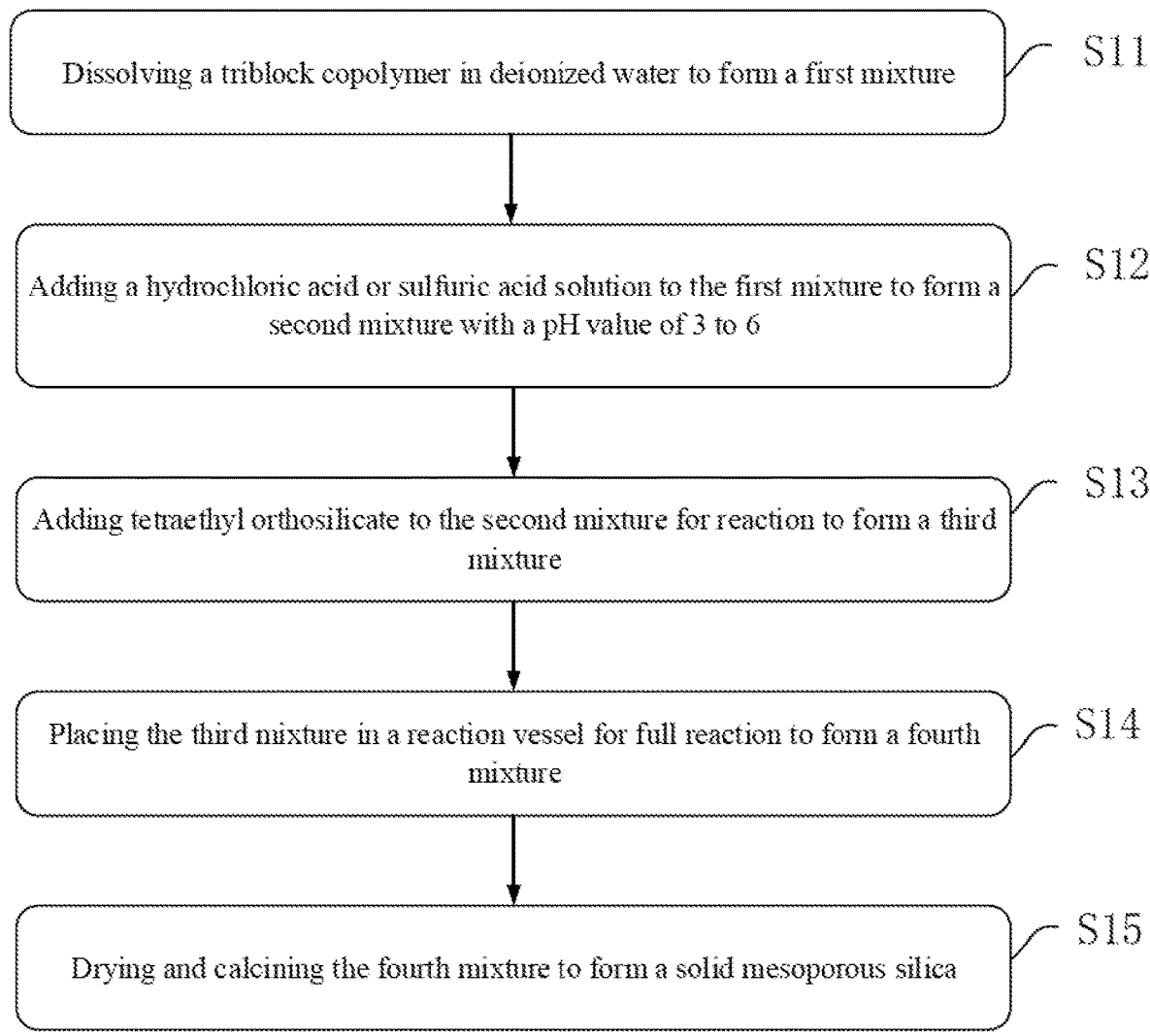
FIG. 2 is a flowchart of a manufacturing method for a mesoporous silica according to an embodiment of the present application.

FIG. 2 is a flowchart of a manufacturing method for a mesoporous silica. As shown in FIG. 2 and with reference to FIG. 1, the step S1 includes substeps of:

S11: dissolving a triblock copolymer in deionized water to form a first mixture;

S12: adding a hydrochloric acid or sulfuric acid solution to the first mixture to form a second mixture with a pH value of 3 to 6:

S13: adding tetraethyl orthosilicate to the second mixture for reaction to form a third mixture;

S14: placing the third mixture in a reaction vessel for full reaction to form a fourth mixture; and S15: drying and calcining the fourth mixture to form a solid mesoporous silica.

The triblock copolymer in the step S11 may be a Polyethylene Oxide-Polypropylene Oxide-Polyethylene Oxide Triblock Copolymer (P123, PEO-PPO-PEO), and the reaction vessel in the step S14 is a high pressure reactor. Specifically, the step S1 includes: weighing and dissolving 3-10 g of the P123 in deionized water, stirring the resulting mixture uniformly to form a first mixture; adding a hydrochloric acid or sulfuric acid solution to the first mixture, adjusting the pH value to 3-6, and stirring the resulting mixture at 30-60° C. for 1-3 h to form a second mixture; adding 5-20 mL of tetraethyl orthosilicate (TEOS, $Si(OC_2H_5)_4$) to the second mixture for reaction for 5-12 hi to form a third mixture; then placing the third mixture in the high pressure reactor, heating to 100-150° C., holding for 12-24 h, and cooling naturally to the room temperature to give the fourth mixture; and calcining the fourth mixture in air at 400-600° C. for 2-5 h after leaching, washing and drying to give a white mesoporous silica (SBA-15) powder. In the present application, the manufacturing method for the mesoporous silica in S1 is a sol-gel method, the manufacturing process of the method is simple, and the formed mesoporous silica has a high purity and is not doped with other impurities. However, the manufacturing method for the mesoporous silica in the present application is not limited to the sol-gel method, and other manufacturing methods for the mesoporous silica are also applicable.

The step S15 includes substeps of:

S151: drying and calcining the fourth mixture to form a solid mesoporous silica with a pore diameter between 2 nm and 10 nm.

The pore diameter of the mesoporous silica in the present application is between 2 nm and 10 nm, which facilitates the filling of the gas-phase precursor, and the size of a reverse-phase material manufactured using the mesoporous silica as a template is also between 2 un and 10 nm, which gives excellent physical properties to the material.

Figure 3:
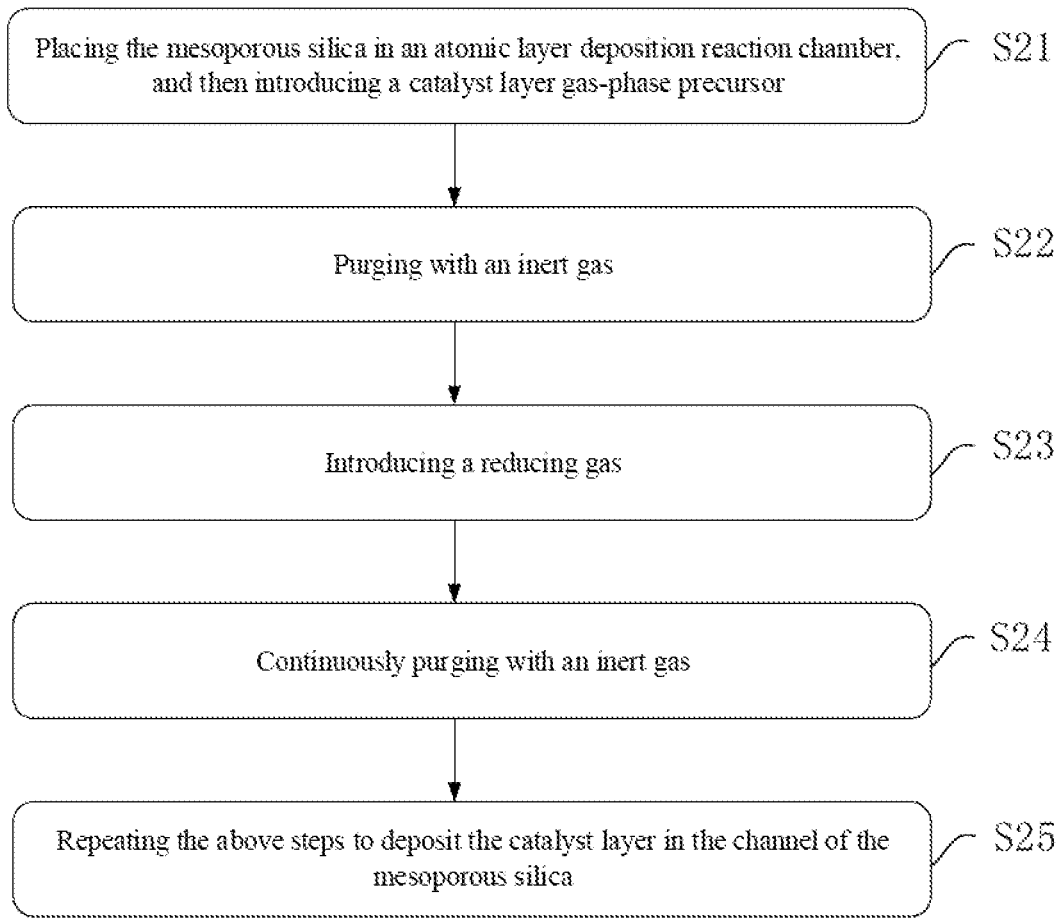
FIG. 3 is a flowchart of depositing a catalyst layer in a mesoporous silica according to an embodiment of the present application.

FIG. 3 is a flowchart of a method for depositing a catalyst layer in a channel of a mesoporous silica. As shown from FIG. 3 and with reference to FIG. 1, the step S2 includes substeps of:

S21: placing the mesoporous silica in an atomic layer deposition reaction chamber, and then introducing a catalyst layer gas-phase precursor;

S22: purging with an inert gas;

S23: introducing a reducing gas;

S24: continuously purging with an inert gas; and

S25: repeating the above steps to deposit the catalyst layer in the channel of the mesoporous silica.

Atomic Layer Deposition (ALD) technique is a special chemical vapor deposition technique, which is a method of forming a film by alternately introducing gas-phase precursor pulses into a reaction chamber and allowing a chemisorption reaction on the surface of a deposition substrate. Precursor molecules reaching the surface of the deposition substrate will chemisorb and react on the surface, the surface reaction of atomic layer deposition is self-limiting. i.e., Chemisorption Self-limiting (CS) and Rearrangement Self-limiting (RS). The self-limiting feature is the basis of atomic layer deposition. By repeating the self-limiting reaction to form nanoparticles or films, excellent three-dimensional conformal stoichiometric films can be produced. Due to the self-limiting chemisorption property on the surface, ALD can be applied to high and deep groove structures, and films deposited by ALD have obvious advantages in uniformity, compactness, step coverage and thickness control. In the present application, the catalyst layer is deposited in the mesoporous silica by ALD, so that the catalyst layer in the mesoporous silica is filled more compactly, and the catalyst layer can be diffused everywhere in the channel of the mesoporous silica by ALD, forming good porosity and specific surface area, so that when a carbon matrix precursor is subsequently introduced, there is enough space in the channel for full reaction.

With reference to steps in FIG. 3, it can be seen from Table 1 that the catalyst layer gas-phase precursor in the step S21 is nickelocene ($Ni(Cp)_2$), the introduced nickelocene can be kept in a gaseous state by controlling the temperature of nickelocene in the reaction chamber, the inert gas in the steps S22 and S24 is Argon (Ar), the reducing gas in the step S23 is plasma hydrogen, and the repeating in the step S25 is for 50 times. The detailed step S2 includes: placing the mesoporous silica in the reaction chamber, then introducing nickelocene into the reaction chamber for 0.02 s, and keeping the nickelocene gas in the reaction chamber for 10 s; purging with argon for 5 s to remove the nickelocene gas in the reaction chamber; introducing hydrogen into the reaction chamber for 0.03 s, and keeping the hydrogen in the reaction chamber for 10 s after the introduction of the hydrogen; then purging with argon for 10 s to remove the hydrogen in the reaction chamber, repeating the steps of introducing the nickelocene gas, purging with argon, introducing hydrogen and purging with argon for 50 times, and finally depositing a sufficient amount of catalyst layer in the channel of the mesoporous silica, where the steps can be preset in a machine. Since the introduced gas-phase precursor is nickelocene, the produced catalyst layer is elemental nickel; certainly, the introduced precursor can also be an iron precursor, and the catalyst layer produced accordingly is elemental iron; even other precursors can be introduced, which are not limited here.

TABLE 1

Parameters in atomic layer deposition step

| S/N | Procedure | Formulation | Time (s) |
|---|---|---|---|
| 1 | Ni precursor (Dose1) | Nickelocene $Ni(Cp)_2$ | 0.02 |
| 2 | Retention time 1 (Reaciton1) | Retention time of nickelocene | 10 |
| 3 | Purge 1 (Purge1) | Purge with Ar | 5 |
| 4 | Reducing gas (Dose2) | Plasma $H_2$ | 0.03 |
| 5 | Retention time 2 (Reaciton2) | Retention time of Plasma $H_2$ | 10 |

TABLE 1-continued

Parameters in atomic layer deposition step

| S/N | Procedure | Formulation | Time (s) |
|---|---|---|---|
| 6 | Purge 2 (Purge2) | Purge with Ar | 10 |
| 7 | Total cycle number (Goto1) | | 50 |
| 8 | End (End) | | |

Figure 4:
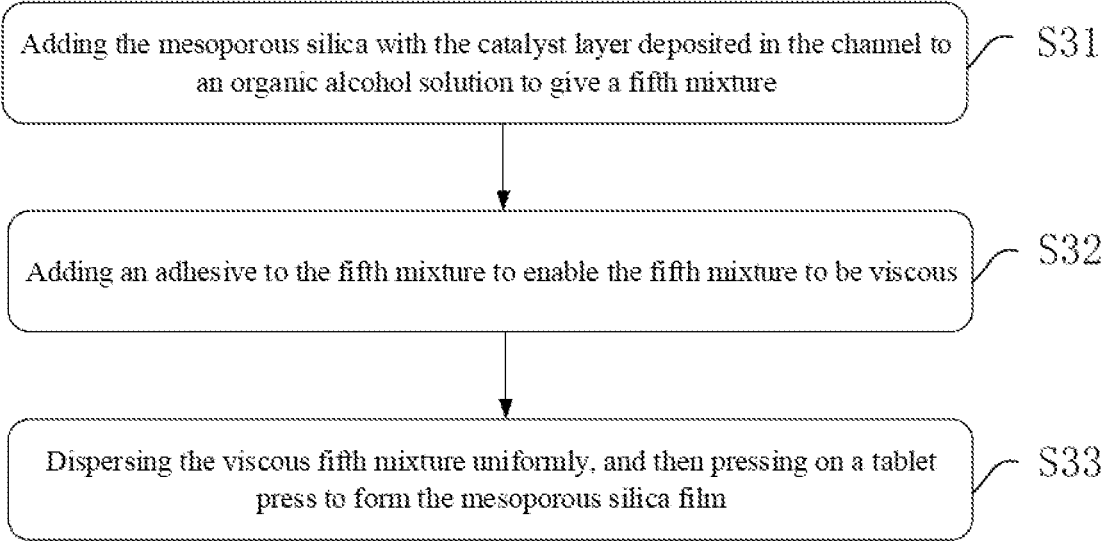
FIG. 4 is a flowchart of manufacturing a mesoporous silica film according to an embodiment of the present application.

FIG. 4 is a flowchart of a manufacturing method for a mesoporous silica film. As shown from FIG. 4 and with reference to FIG. 1, the step S3 further includes substeps of:

S31: adding the mesoporous silica with the catalyst layer deposited in the channel to an organic alcohol solution to give a fifth mixture;

S32: adding an adhesive to the fifth mixture to enable the fifth mixture to be viscous; and S33: dispersing the viscous fifth mixture uniformly, and then pressing on a tablet press to form the mesoporous silica film.

Specifically, the organic alcohol solution in the step S31 includes ethanol, propanol or butanol, and the adhesive in the step S32 includes Polytetrafluoroethylene (PTFE, $(C2F4)n$). The detailed step S3 includes: weighing 3-5 g of the mesoporous silica deposited with the catalyst layer, adding 10-50 mL of alcohol solution to form a fifth mixture, then adding 2-8 mL of PTFE to enable the fifth mixture to be viscous, dispersing the mixture uniformly, and then pressing on the tablet press to form a film. In the step, the mesoporous silica with the catalyst layer deposited in the channel is added to the organic alcohol solution, since the organic alcohol solution will not react with the mesoporous silica and the catalyst layer, and the organic alcohol solution is volatile, the resulting carbon nanotube film is free of impurities.

FIG. 5 is a flowchart of a manufacturing method for a nanotube film. As shown from FIG. 5 and with reference to FIG. 1, the step S4 includes substeps of:

S41: placing the mesoporous silica film in a chemical vapor deposition chamber, then introducing a gas mixture of argon and hydrogen, and heating; and S42: introducing the carbon matrix precursor into the chemical vapor deposition chamber, and cooling to give the carbon nanotube film containing single-walled carbon nanotubes.

Specifically, in the step S41, parameters in the chemical vapor deposition chamber are shown in Table 2; and the flow ratio of argon to hydrogen in the introduced gas mixture of argon and hydrogen is 20:1 to 10:1; and in the step S42, the carbon matrix precursor includes $CH_4$, $C_2H_2$, $C_2H_6$, or the like. $CH_4$ in the table below can be replaced by $C_2H_2$ or $C_2H_4$, the flow rate of $C_2H_2$ is 5-20 sccm when $CH_4$ is replaced by $C_2H_2$, and the flow rate of $C_2H_6$ is 5-25 sccm when $CH_4$ is replaced by $C_2H_6$, but the flow rate of hydrogen remains unchanged regardless of the material by which $CH_4$ is replaced. The detailed step S4 includes: placing the mesoporous silica film in the CVD chamber, introducing the gas mixture of argon and hydrogen, heating to 700-1000° C., then introducing the carbon matrix precursor for growth for 60-300 s, and cooling to give the carbon nanotube film; introducing the carbon matrix precursor into the channel of the mesoporous silica film by chemical vapor deposition, and reacting under the catalysis of the catalyst layer to form the carbon nanotube film. High deposition efficiency can be realized by chemical vapor deposition, so that the deposition of the carbon matrix precursor can be completed in a short time, thus improving the productivity.

TABLE 2

Parameters in chemical vapor deposition chamber

| $H_2$ (sccm) | $CH_4$ (sccm) | Power (w) | Intensity of pressure (Pa) | Time(s) | Temperature (° C.) |
|---|---|---|---|---|---|
| 10-30 | 10-30 | 300-500 | 100-150 | 60-300 | 700-1000 |

FIG. 6 is a flowchart of a manufacturing method for a transparent carbon nanotube conductive film. As shown from FIG. 6 and with reference to FIG. 1, the step S5 further includes substeps of:

S51: heating and annealing the carbon nanotube film;

S52: placing the carbon nanotube film subjected to heating and annealing in a hydrofluoric acid or sodium hydroxide solution to give a carbon nanotube film with the mesoporous silica removed; and S53: placing the carbon nanotube film with the mesoporous silica removed in an aluminum chloride solution or ferric chloride solution, to give a transparent carbon nanotube conductive film with the catalyst layer removed.

In the step S51, the heating and annealing means that the carbon nanotube film is heated and then naturally cooled; in addition, the step S53 can be followed by the step S52, that is, placing the carbon nanotube film in an aluminum chloride solution or ferric chloride solution to remove the catalyst layer, then placing the carbon nanotube film with the catalyst layer removed in a hydrofluoric acid or sodium hydroxide solution to remove the mesoporous silica, and finally giving the transparent carbon nanotube conductive film. The transparency of the carbon nanotube conductive film is improved by removing impurities in the carbon nanotubes, thus improving the displayed aperture ratio and light transmittance. In addition, pure carbon nanotubes have good conductive effect, so that the conductivity of the carbon nanotube conductive film can be improved by removing the mesoporous silica and the catalyst layer from the carbon nanotube conductive film.

Figure 7:
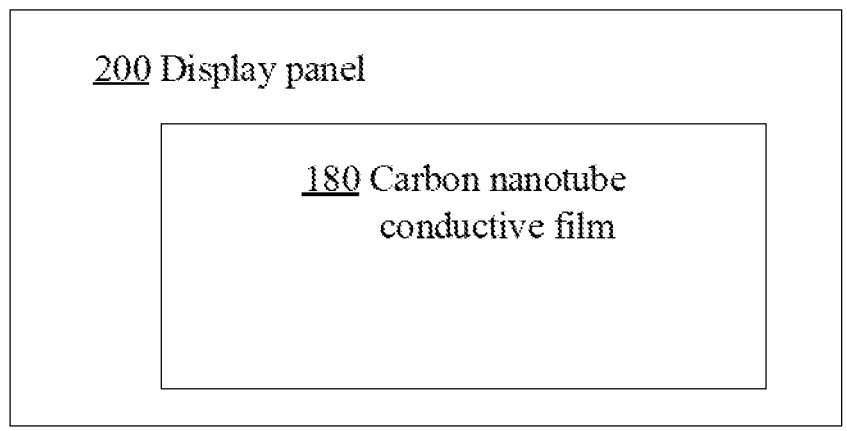
FIG. 7 is a schematic diagram of a display panel according to another embodiment of the present application.
Figure 8:
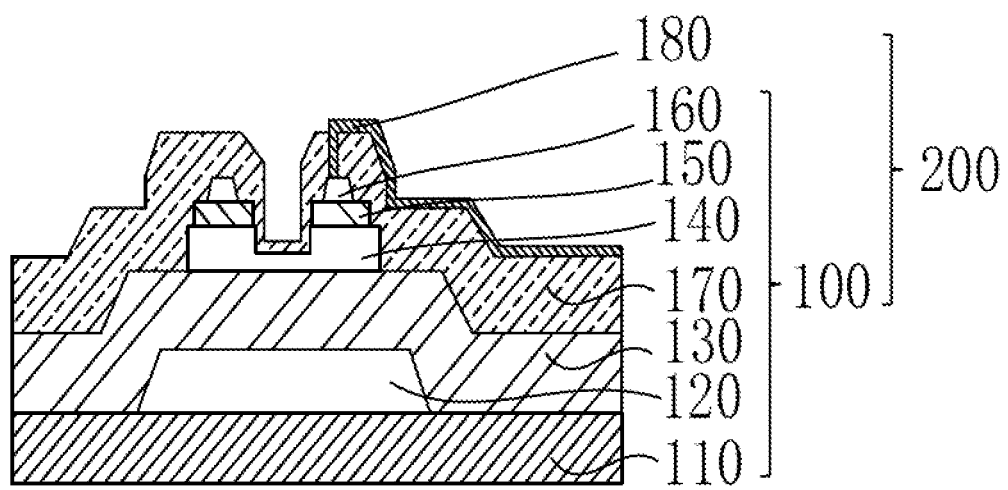
FIG. 8 is a schematic diagram of an active switch of another embodiment of the present application.

As shown in FIG. 7 and FIG. 8, as another embodiment of the present application, a display panel 200 is disclosed, where the display panel 200 includes a carbon nanotube conductive film 180 manufactured by the manufacturing method for a carbon nanotube conductive film.

Figure 9:
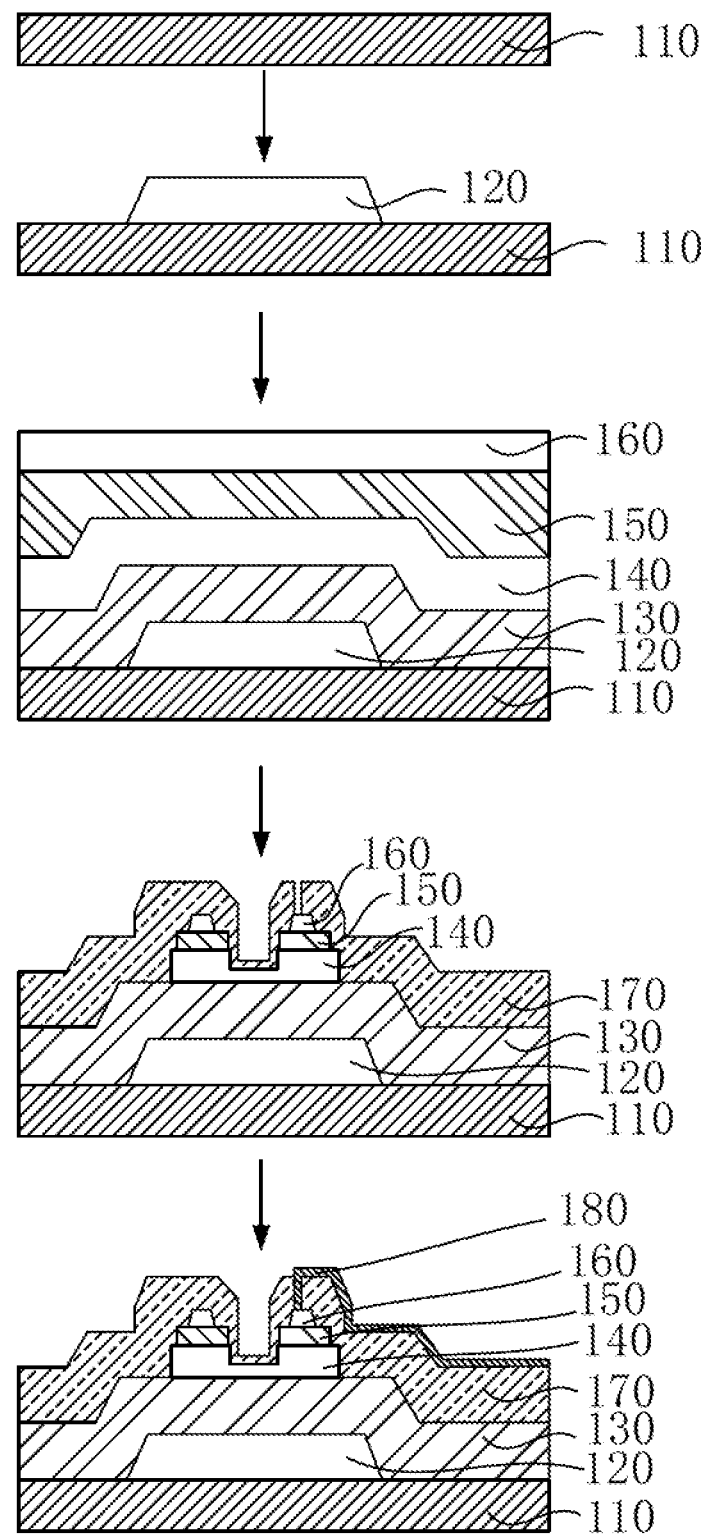
FIG. 9 is a schematic diagram of manufacturing an active switch and a carbon nanotube conductive film according to another embodiment of the present application.

Specifically, the display panel 200 further includes an active switch 100, the active switch 100 includes a substrate 110, a gate metal layer 120, a gate insulating layer 130, an active layer 140, an ohmic contact layer 150, a source/drain metal layer 160 and a passivation layer 170 which are sequentially stacked, and the carbon nanotube conductive film 180 is connected to the source/drain metal layer 160 through a via hole in the passivation layer 170. The carbon nanotube conductive film 180 is manufactured by the manufacturing method for a carbon nanotube conductive film. With the carbon nanotube conductive film 180 manufactured by the manufacturing method for a carbon nanotube conductive film, the conductivity of the active switch 100 is improved, the aperture ratio is increased, and the performance of the active switch 100 is more stable. As shown in FIG. 9, the present application further discloses a manufacturing process for the active switch 100 and the carbon nanotube conductive film 180. In addition, the display panel includes an array substrate and a color film substrate disposed opposite to the array substrate, and the carbon nanotube conductive film 180 can also be configured as a common electrode on the color filter substrate side, and other applicable cases.

Figure 10:
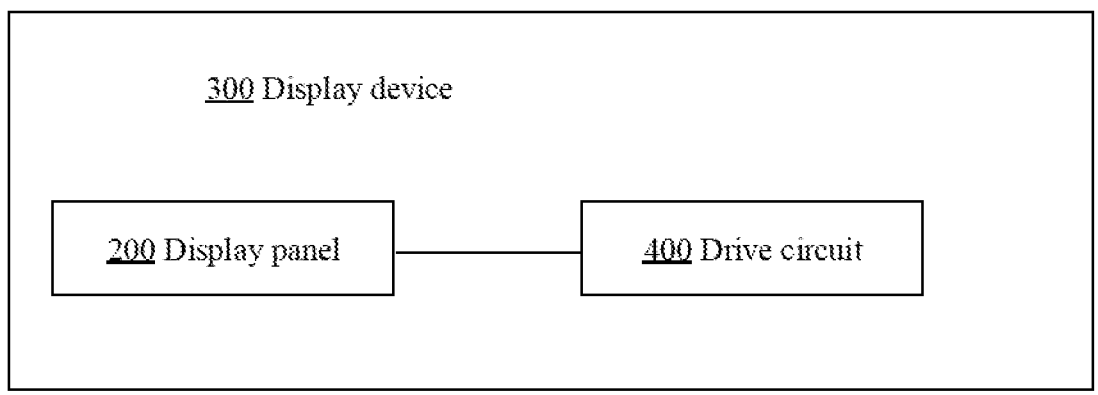
FIG. 10 is a schematic diagram of a display device according to another embodiment of the present application.

As shown in FIG. 10, as another embodiment of the present application, a display device 300 is disclosed, including the display panel 200 and a drive circuit 400 configured for driving the display panel 200.

It should be noted that, the limitation of the steps involved in this solution, without affecting the implementation of the specific solution, is not determined to limit the sequence of steps, and the previous steps may be executed first, later, or even simultaneously; solutions of different embodiments can be combined without conflict, and as long as this solution can be implemented, it shall fall within the protection scope of the present application.

The technical scheme of the present application can be widely used in various display panels, such as Twisted Nematic (TN) display panels, In-Plane Switching (IPS) display panels, Vertical Alignment (VA) display panels and Multi-Domain Vertical Alignment (IVA) display panels, and, of course, other types of display panels, such as Organic Light-Emitting Diode (OLED) display panels.

The above content is a further detailed description of the present application in conjunction with specific, optional embodiments, and it is not to be construed that specific embodiments of the present application are limited to these descriptions. For those of ordinary skill in the art to which this application belongs, a number of simple derivations or substitutions may be made without departing from the spirit of this application, all of which shall be deemed to fall within the scope of this application.

What is claimed is:

1. A manufacturing method for a carbon nanotube conductive film, comprising steps of:
    forming a mesoporous silica;
    depositing a catalyst layer in a channel of the mesoporous silica by atomic layer deposition;
    manufacturing the mesoporous silica with the catalyst layer deposited in the channel into a mesoporous silica film;
    introducing a carbon matrix precursor into the channel of the mesoporous silica film by chemical vapor deposition, and reacting under the catalysis of the catalyst layer to form a carbon nanotube film; and
    removing the mesoporous silica and the catalyst layer from the carbon nanotube film to form the transparent carbon nanotube conductive film.

2. The manufacturing method for a carbon nanotube conductive film according to claim 1, wherein the step of forming a mesoporous silica comprises substeps of:
    dissolving a triblock copolymer in deionized water to form a first mixture;
    adding a hydrochloric acid or sulfuric acid solution to the first mixture to form a second mixture with a pH value of 3 to 6;
    adding tetraethyl orthosilicate to the second mixture for reaction to form a third mixture;
    placing the third mixture in a reaction vessel for full reaction to form a fourth mixture; and
    drying and calcining the fourth mixture to form a solid mesoporous silica.

3. The manufacturing method for a carbon nanotube conductive film according to claim 2, wherein the triblock copolymer comprises P123.

4. The manufacturing method for a carbon nanotube conductive film according to claim 2, wherein the step of placing the third mixture in a reaction vessel for full reaction to form a fourth mixture comprises: placing the third mixture in a high pressure reactor, heating to 100-150° C., holding for 12-24 h, and naturally cooling to room temperature to give the fourth mixture.

5. The manufacturing method for a carbon nanotube conductive film according to claim 2, wherein the step of drying and calcining the fourth mixture to form a solid mesoporous silica comprises: calcining the fourth mixture in air at 400-600° C. for 2-5 h after leaching, washing and drying to give a white mesoporous silica powder.

6. The manufacturing method for a carbon nanotube conductive film according to claim 2, wherein the step of drying and calcining the fourth mixture to form a solid mesoporous silica comprises substeps of:
    drying and calcining the fourth mixture to form a solid mesoporous silica with a pore diameter between 2 nm and 10 nm.

7. The manufacturing method for a carbon nanotube conductive film according to claim 1, wherein the step of depositing a catalyst layer in a channel of the mesoporous silica by atomic layer deposition comprises substeps of:
    placing the mesoporous silica in an atomic layer deposition reaction chamber, and then introducing a catalyst layer gas-phase precursor;
    purging with an inert gas;
    introducing a reducing gas;
    continuously purging with an inert gas; and
    repeating the above steps to deposit the catalyst layer in the channel of the mesoporous silica.

8. The manufacturing method for a carbon nanotube conductive film according to claim 7, wherein the catalyst layer gas-phase precursor is gas-phase nickelocene, and the catalyst layer is a metallic nickel catalyst layer.

9. The manufacturing method for a carbon nanotube conductive film according to claim 8, wherein the step of placing the mesoporous silica in an atomic layer deposition reaction chamber and then introducing a catalyst layer gas-phase precursor comprises introducing the nickelocene into the reaction chamber for 0.02 s, and keeping the nickelocene gas in the reaction chamber for 10 s;
    the step of purging with an inert gas comprises purging with argon for 5 s to remove the nickelocene gas in the reaction chamber;
    the step of introducing a reducing gas comprises introducing hydrogen into the reaction chamber for 0.03 s, and keeping the hydrogen in the reaction chamber for 10 s after the introduction of the hydrogen; and
    the step of continuously purging with an inert gas comprises purging with argon for 10 s to remove the hydrogen in the reaction chamber.

10. The manufacturing method for a carbon nanotube conductive film according to claim 7, wherein the step of repeating the above steps to deposit the catalyst layer in the channel of the mesoporous silica comprises repeating for 50 times.

11. The manufacturing method for a carbon nanotube conductive film according to claim 7, wherein the catalyst layer gas-phase precursor is an iron precursor, and the catalyst layer is a metallic iron catalyst layer.

12. The manufacturing method for a carbon nanotube conductive film according to claim 1, wherein the step of manufacturing the mesoporous silica with the catalyst layer deposited in the channel into a mesoporous silica film comprises substeps of:
    adding the mesoporous silica with the catalyst layer deposited in the channel to an organic alcohol solution to give a fifth mixture;

adding an adhesive to the fifth mixture to enable the fifth mixture to be viscous; and dispersing the viscous fifth mixture uniformly, and then pressing on a tablet press to form the mesoporous silica film.

13. The manufacturing method for a carbon nanotube conductive film according to claim 12, wherein weighing 3-5 g of the mesoporous silica deposited with the catalyst layer, adding 10-50 mL of alcohol solution to form a fifth mixture, then adding 2-8 mL of PTFE to enable the fifth mixture to be viscous, dispersing the mixture uniformly, and then pressing on the tablet press to form the film.

14. The manufacturing method for a carbon nanotube conductive film according to claim 1, wherein the step of introducing a carbon matrix precursor into the channel of the mesoporous silica film by chemical vapor deposition, and reacting under the catalysis of the catalyst layer to form a carbon nanotube film comprises substeps of:

placing the mesoporous silica film in a chemical vapor deposition chamber, then introducing a gas mixture of argon and hydrogen, and heating; and introducing the carbon matrix precursor into the chemical vapor deposition chamber, and cooling to give the carbon nanotube film containing single-walled carbon nanotubes.

15. The manufacturing method for a carbon nanotube conductive film according to claim 14, wherein the flow ratio of argon to hydrogen is between 20:1 and 10:1.

16. The manufacturing method for a carbon nanotube conductive film according to claim 14, wherein placing the mesoporous silica film in a CVD chamber, introducing a gas mixture of argon and hydrogen, heating the CVD chamber to 700-1000° C., then introducing the carbon matrix precursor for growth for 60-300 s, and cooling the CVD chamber to give the carbon nanotube film.

17. The manufacturing method for a carbon nanotube conductive film according to claim 1, wherein the step of removing the mesoporous silica and the catalyst layer from the carbon nanotube film to form the transparent carbon nanotube conductive film comprises substeps of:

heating and annealing the carbon nanotube film;

placing the carbon nanotube film subjected to heating and annealing in a hydrofluoric acid or sodium hydroxide solution, to give a carbon nanotube film with the mesoporous silica removed; and placing the carbon nanotube film with the mesoporous silica removed in an aluminum chloride solution or ferric chloride solution, to give a transparent carbon nanotube conductive film with the catalyst layer removed.

18. The manufacturing method for a carbon nanotube conductive film according to claim 1, wherein the step of removing the mesoporous silica and the catalyst layer from the carbon nanotube film to form the transparent carbon nanotube conductive film comprises: placing the carbon nanotube film in an aluminum chloride solution or ferric chloride solution to remove the catalyst layer, then placing the carbon nanotube film with the catalyst layer removed in a hydrofluoric acid or sodium hydroxide solution to remove the mesoporous silica, and finally giving the transparent carbon nanotube conductive film.

* * * * *